US008530981B2

(12) United States Patent
Huckabee et al.

(10) Patent No.: US 8,530,981 B2
(45) Date of Patent: Sep. 10, 2013

(54) LEADFRAME-BASED PREMOLDED PACKAGE HAVING ACOUSTIC AIR CHANNEL FOR MICRO-ELECTRO-MECHANICAL SYSTEM

(75) Inventors: James Richard Huckabee, Sherman, TX (US); Ray H. Purdom, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 215 days.

(21) Appl. No.: 12/969,821

(22) Filed: Dec. 16, 2010

(65) Prior Publication Data

US 2011/0156176 A1 Jun. 30, 2011

Related U.S. Application Data

(60) Provisional application No. 61/291,777, filed on Dec. 31, 2009.

(51) Int. Cl.
*H01L 29/66* (2006.01)
*H01L 21/02* (2006.01)

(52) U.S. Cl.
USPC ............................................. 257/414; 438/48

(58) Field of Classification Search
CPC ......... H01L 23/48; H01L 29/66; H01L 21/02; B81B 7/02

USPC ............. 257/414, E29.166, E21.002; 438/48
See application file for complete search history.

(56) References Cited

U.S. PATENT DOCUMENTS

| 8,184,845 | B2 * | 5/2012 | Leidl et al. ..................... 381/369 |
| 2007/0040231 | A1 | 2/2007 | Harney et al. |
| 2007/0205492 | A1 | 9/2007 | Wang |
| 2007/0228499 | A1 | 10/2007 | Dangtran et al. |
| 2009/0263937 | A1 | 10/2009 | Ramakrishna et al. |

* cited by examiner

*Primary Examiner* — Walter H Swanson
(74) *Attorney, Agent, or Firm* — Warren L. Franz; Wade J. Brady, III; Frederick J. Telecky, Jr.

(57) ABSTRACT

A low-cost microelectromechanical system (MEMS) device has a mass-produced carrier fabricated as a pre-molded leadframe so that the space of the leadframe center is filled with compound and a two-tier stepped recess is created in the center. The first tier is filled by an inset with a first perforation and a second perforation. An integrated circuit chip with an opening and a membrane at the end of the opening, operable as a pressure sensor, microphone, speaker, etc., is assembled on the inset so that the chip opening is aligned with the first perforation. The chip is protected by a cover transected by a vent aligned with the second inset perforation. An air channel extends from the ambient exterior through the vent and the second perforation to the second tier recess, which acts as a channel and connects to the first perforation and the chip opening to the membrane.

15 Claims, 5 Drawing Sheets

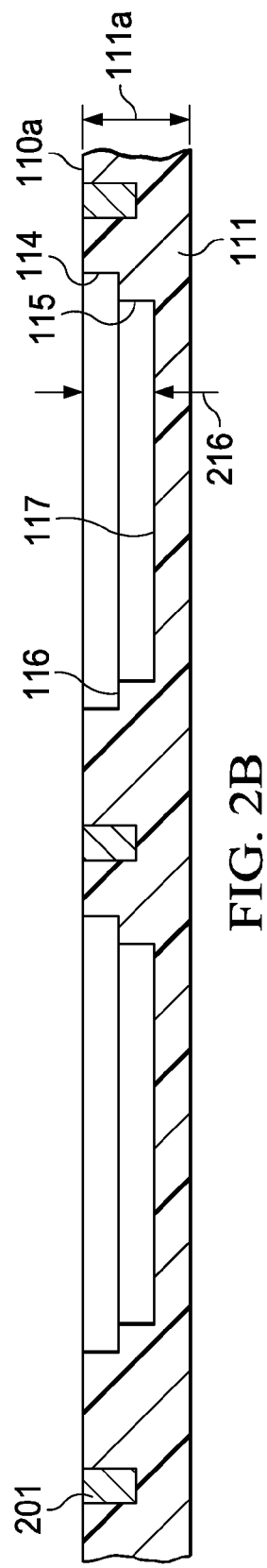
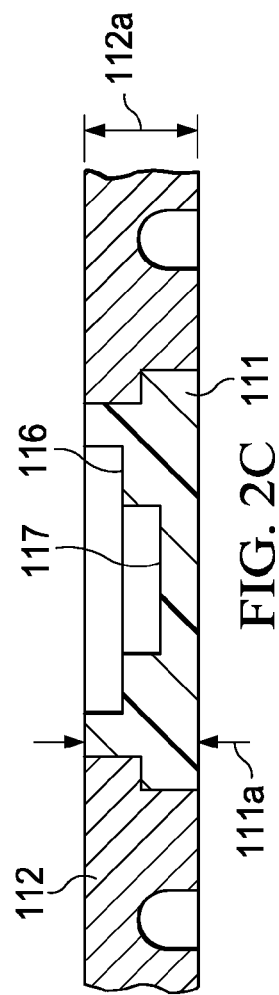

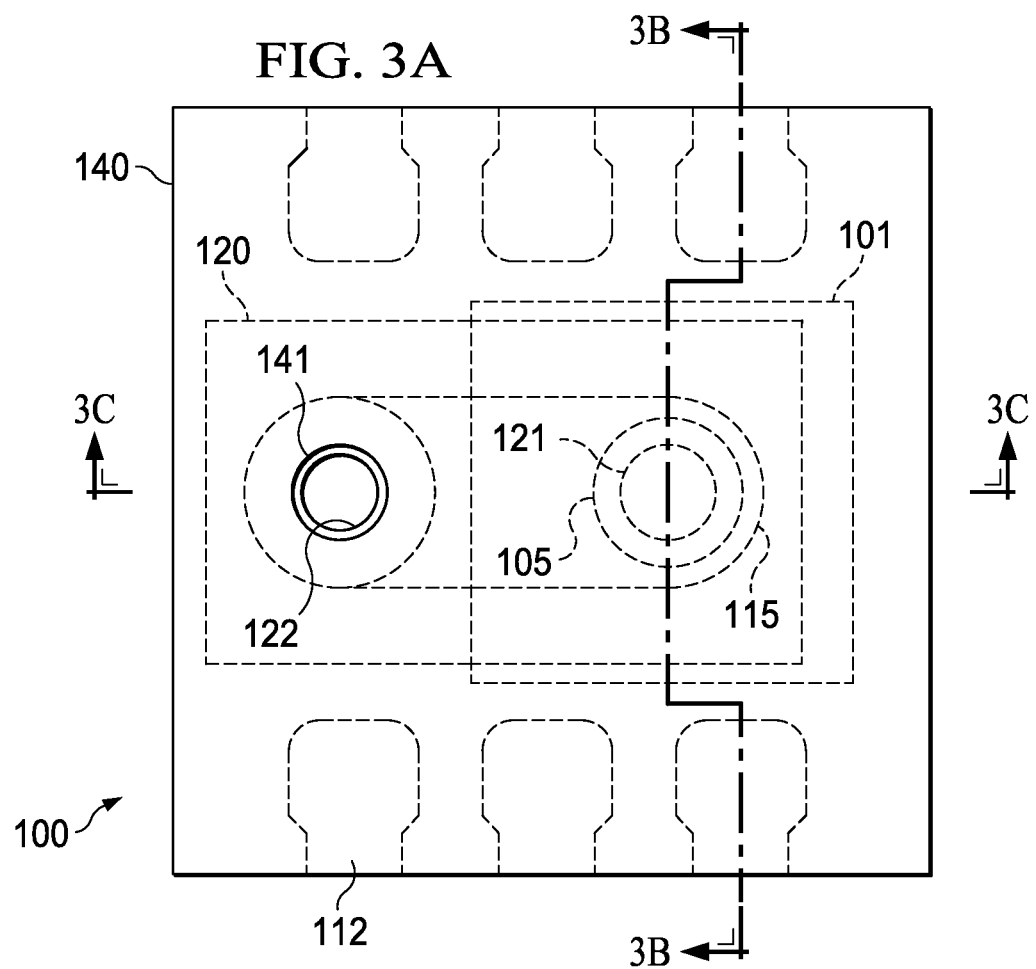

LEADFRAME-BASED PREMOLDED PACKAGE HAVING ACOUSTIC AIR CHANNEL FOR MICRO-ELECTRO-MECHANICAL SYSTEM

FIELD OF THE INVENTION

The present invention is related in general to the field of semiconductor devices and processes, and more specifically to the structure and fabrication method of microelectromechanical system (MEMS) devices in leadframe-based premolded packages with acoustic channel suitable for microphones, speakers, and pressure gauges.

DESCRIPTION OF RELATED ART

The wide variety of products collectively called microelectromechanical system (MEMS) devices are small, low weight devices on the micrometer scale, which may have mechanically moving parts, including transducers and actuators, and may have parts sensitive to thermal, acoustic, or optical energy. Because of the moving and sensitive parts, MEMS devices have a need for physical and atmospheric protection. Consequently, MEMS devices are typically placed on a substrate and surrounded by a housing or package, which shields the MEMS device against ambient and electrical disturbances, and against stress.

A MEMS device integrates mechanical elements, sensors, actuators, and electronics on a common substrate. MEMS device manufacturing aims at using batch fabrication techniques similar to those used for non-MEMS microelectronics devices. MEMS devices can thus benefit from mass production and minimized material consumption to lower the manufacturing cost, while trying to exploit the well-controlled integrated circuit technology, although today the production of MEMS devices is still far from the level of maturity that manufacturing and packaging of microelectronics have reached.

MEMS devices may be mechanical sensors, both pressure sensors such as microphone membranes, and inertial sensors such as accelerometers, either of which may be coupled with the integrated electronic circuit of the chip. Mechanical sensors react to and measure pressure, force, torque, flow displacement, velocity, acceleration, level, position, tilt, and acoustic wavelength and amplitude. Among the general requirements for pressure sensors are long term stability, small temperature sensitivity, low pressure and temperature hysteresis, resistance to corrosive ambients, and often hermeticity. Two specific bulk micromachining processes employed in MEMS sensor production to create in bulk semiconductor crystals the movable elements and the cavities for their movements are anisotropic wet etching and deep reactive ion etching (DRIE).

The semiconductor MEMS pressure sensors and microphones are assembled on insulating substrates, which include multi-level metallizations patterned for horizontal and vertical connections. As an example, the substrate may have four metallization levels. The assembly typically involves adhesive chip attachment and metal wire bonding to the terminals. In many products, the terminals are positioned similar to the compact Small Outline No-Lead (SON) or Quad Flat No-Lead (QFN) type semiconductor devices, since they show the compact outline of chip-size packages. The substrates also include the air channels needed to expose the membranes to the ambient pressure and acoustic signals to be monitored by the MEMS devices. For protection and robustness reasons, the chip, wires, and portions of the substrate are packaged in a metal can or molded in a plastic encapsulation. As an example, the dimensions of a MEMS cuboid analog-output microphone with four terminals for mobile phones may be about 4.8 mm by 3.8 mm by 1.25 mm, or even as small as 2 mm by 2 mm by 1.25 mm (resulting in a 4 mm$^2$ footprint).

SUMMARY OF THE INVENTION

Applicants recognized that the fast growing popularity of MEMS devices with an internal cavity and their wide diversification are strongly dependent on a fabrication cost lower than today. As an example, low manufacturing cost and small size are dominant requirements in order to integrate pressure sensors, microphones, accelerometers and other applications, where a movable member is needed to convert an external analog input into an electrical output, into applications of portable and consumer electronic devices in automotive, medical, and aerospace industries.

Applicants saw that to build MEMS devices on substrates with patterned multi-level metallizations is not only a high cost approach, but also limits the choice of materials and configuration available to the MEMS component. Furthermore, the complexity of multi-metal level substrate fabrication makes these MEMS devices inflexible to rapidly changing customer requirements or market opportunities.

Applicants solved the problem of mass-producing low cost MEMS devices with a membrane suitable for pressure and sound sensing, microphones, and speakers, by assembling the chip with the membrane on a carrier including a pre-molded leadframe. The molding process, which embeds the leads of the leadframe, also forms a two-tier recess. An inset (made of plastic, copper, silicon, or other suitable material) placed in the first tier is attached to the step between the tiers and confines the second tier to the function of an internal air channel. The inset, which provides the area for assembling the chip with the membrane, has a perforation for connecting the air channel to the external ambient, and another perforation for connecting the air channel to the membrane. Since the size and the outline of the inset as well as the number and location of the perforations can be customized, the inset adds low-cost design variability to the MEMS device fabrication. In addition, the inset may be made of inexpensive amorphous silicon, which has the same coefficient of thermal expansion (CTE) as the single crystalline silicon of the chip and thus supports the effort to minimize CTE mismatches between the package materials. The assembly process does not employ lasers and thus supports cost reduction.

Applicants further discovered that a leadframe of the QFN/SON type allows greater system level integration with other components such as package-on-package MEMS devices, thus increasing the electrical product efficiency.

Embodiments of this invention include the usage of air pressure, electrostatic force, gravity, gas composition, etc., to deflect a membrane or a beam for building pressure sensors, microphones, accelerometers, relays, thermopiles, and other applications where a movable member is needed to convert an external input into an electrical output.

Exemplary MEMS devices of the pressure sensor family, operating on capacitive changes caused by a movable membrane, may offer 20 to 30% lower fabrication cost, when the chip with the membrane is assembled on a pre-molded leadframe with lid, instead of being fabricated in conventional manner with a multi-level substrate.

According to one embodiment of the present invention, a MEMS device is provided that comprises a carrier having a height and a surface, the carrier embedding at its periphery a plurality of metal leads; a recess in the carrier, remote from the periphery, the first tier extending from the surface to a step towards the second tier; an inset attached to the step and having a first perforation and a second perforation; a integrated circuit chip attached to the inset, the chip having an opening extending through the chip capped by a foil, the opening in communication with the first perforation of the inset; and a cover attached to the surface of the carrier enclosing the chip and having a vent in communication with the second perforation of the inset.

According to another embodiment of the present invention, a MEMS device is provided that comprises a carrier having a height and a surface, the carrier embedding at its periphery a plurality of metal leads; a recess in the carrier, remote from the periphery, extending from the surface to a depth less than the carrier height; an inset attached to the step and having a first perforation and a second perforation.

According to another embodiment of the present invention, a method for fabricating a MEMS device is provided that comprises the steps of: providing a leadframe having a plurality of leads surrounding a central open space, the leads made from a metal sheet having a height; filling the open space with a polymeric compound, thereby embedding the leads and forming a carrier having the height and a surface; forming a recess in the open space; attaching an inset having a first perforation and a second perforation; attaching an integrated circuit chip having an opening extending through the chip, the opening capped by a foil at the circuit side and unobstructed at the opposite side, onto the inset so that the opening is in communication with the first perforation; and attaching a cover onto the surface of the carrier to enclose the chip.

According to another embodiment of the present invention, a method for fabricating a MEMS device is provided that comprises the steps of: providing a leadframe having a plurality of leads surrounding a central open space, the leads made from a metal sheet having a height; filling the open space with a polymeric compound, thereby embedding the leads and forming a carrier having the height and a surface; forming a recess in the open space; and attaching an inset having a first perforation and a second perforation.

BRIEF DESCRIPTION OF THE DRAWINGS

FIG. 2B is a cross section view taken along line 2B-2B of the pre-molded leadframe strip of FIG. 2A.

FIG. 2C is a cross section view taken along line 2C-2C of the pre-molded leadframe strip of FIG. 2A.

FIG. 3A is a top view of a singulated MEMS device fabricated according to the invention with a pre-molded leadframe and acoustic air channel.

DETAILED DESCRIPTION OF THE PREFERRED EMBODIMENTS

Figure 1:
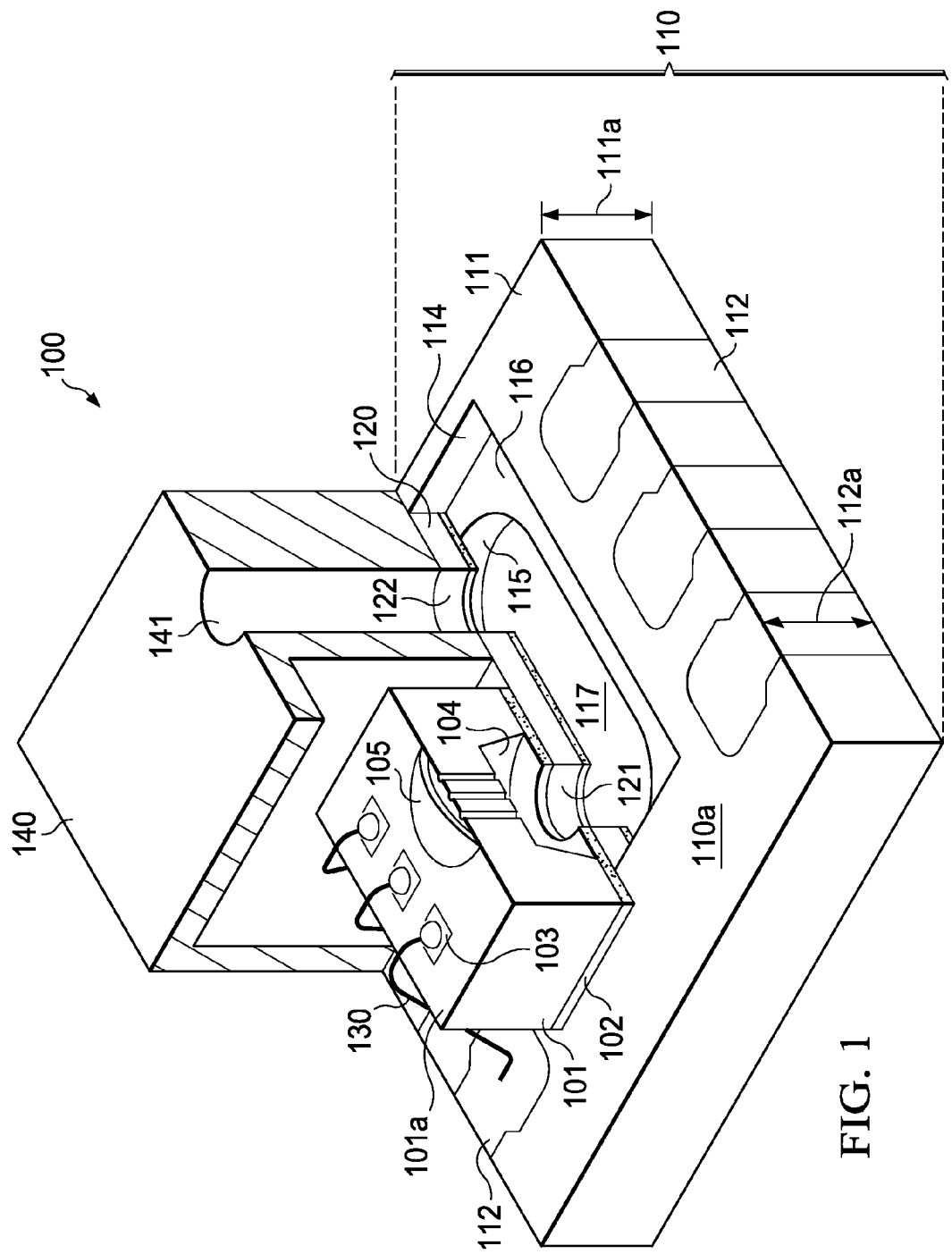
FIG. 1 is a cutaway perspective view of a MEMS device with an acoustic air channel in a leadframe-based pre-molded package according to the invention.

FIG. 1 illustrates a cutaway perspective view of an example embodiment 100 from a family of MEMS devices, which is based on the usage of air pressure, electrostatic force, gravity, gas composition, etc., to deflect a membrane or a beam for building pressure sensors, microphones, speakers, accelerometers, relays, thermopiles, and other applications where a movable member is needed to convert an external input into an electrical output.

As FIG. 1 shows, an integrated circuit chip 101 is attached by adhesive film 102 onto a carrier 110. The carrier includes a polymeric or other compound 111 embedding metallic leads 112, and an inset 120. The example MEMS device has a square-shaped outline of about 2 mm side length. Other embodiments may have greater or smaller side lengths, or they may have a rectangular outline. As FIG. 1 indicates, there are three leads on two opposite sides of carrier 110. Other embodiments may have more leads or fewer leads. The leads may be distributed symmetrically or be clustered. Also, not all leads need be positioned at the body outline.

The material of portion 111 of carrier 110 may be a polymerized molding compound based on an epoxy and filled with inorganic fillers such as silicon dioxide or silicon carbide, or it may be any other suitable plastic compound. The leads 112 may be copper, a copper alloy, aluminum, or any other metal or alloy used in the semiconductor industry as the basis for leadframes. The surface of the leads 112 may have a metallurgical surface configuration suitable for wire bonding (thin layer of silver or gold) or soldering (layer of tin, thin layers of nickel and palladium or gold). The carrier portion made of polymeric compound 111 has a thickness of height 111a, and leads 112 have a height 112a. In FIG. 1, height 111a is the same as height 112a due to the starting leadframe and subsequent molding process used for fabricating carrier 110 (see below). Consequently, the surface of carrier 110 has the same flat plane for the leads and the plastic portion. In FIG. 1, the surface is designated 110a. In the example embodiment of FIG. 1, height 112a of the leads is between about 0.35 and 0.40 mm, and height 111a of the polymeric compound is also between about 0.35 and 0.40 mm.

FIG. 1 further indicates that, towards the center of carrier 110 and extending from surface 110a, a recess is formed into the polymeric compound 111. The recess is structured in two tiers 114 and 115. In the example embodiment of FIG. 1, the two tiers are shown to have the same depth. In other embodiments, the depths may be different. The tiers of FIG. 1 have a depth between about 0.12 and 0.13 mm. The sum of the two tiers has a total depth less than the height 111a of the plastic carrier portion. Between tier 114 and tier 115 is a step 116, which projects from the first tier 114 to the second tier 115. In the example embodiment of FIG. 1, the step extends around the periphery of the recess In other embodiments there may be a plurality of discrete steps. FIG. 1 indicates that, as a result of the recess, the bottom area of second tier 115 forms a channel 117 through a major portion of carrier 110. This channel 117 is a portion of the air channel of the MEMS device (see detail below).

As FIG. 1 shows, inset 120 rests on step 116 and may be attached to step 116 by an adhesive film such as a B-stage chip attach compound; examples include epoxy- and polyimide-based formulations. The inset has a size (area and outline) and a thickness to fill the first tier recess 114 and thus acts as a cover for the second tier 115 and a carrier for attaching the semiconductor chip. Inset 120 may be made of polycrystalline silicon to offer the same coefficient of thermal expansion (CTE) as chip 101. Alternatively, inset 120 may be made of plastic or a metal such as a copper alloy, aluminum, or nickel, or other suitable compounds. FIG. 1 further indicates that inset 120 has a first perforation opening 121 adjacent one end of the inset, and a second perforation opening 122 adjacent the opposite end of the inset. Both perforations open to the channel 117.

The integrated circuit of chip 101 is located on the chip surface 101a in FIG. 1. Surface 101a also has the chip terminals 103 for connections 130 to contacts or leads of the carrier 110. The chip surface opposite surface 101a is, at least partially, attached to inset 120 by adhesive film 102. This film may be a B-stage chip attach compound, for instance an epoxy-based formulation; alternatively, adhesive film 102 may be a polyimide layer. As FIG. 1 illustrates, chip 101 has an opening 104 extending through the height of the chip. Opening 104 may be shaped as a cylinder, a truncated cone, or any other suitable stereometrical form. At the circuit side, the opening 104 is capped by a movable part 105. In the embodiment of FIG. 1, the movable part 105 stretches across the opening 104 and is anchored in the chip in x- and y-directions along the circumference of the opening. In other embodiments, the movable part extends only partially across the opening 104.

Electrical connections 130 may be gold wires as used in conventional semiconductor ball bonding, with a wire diameter of about 25 μm. Wires 130 connect chip terminals 103 to the metal leads 112 embedded in carrier 110.

Movable part 105 may be made of metal such as copper, nickel, or aluminum in some embodiments, with a surface made of palladium or gold. For many embodiments, movable part 105 has an area between about 0.04 and 0.25 mm$^2$ and a thickness between about 5 and 25 μm. In this thickness range, movable part 105 can act as a membrane, which is a foil flexible in the z-direction, movable normal to the surface 101a and thus also normal to body surface 110a in the space of the chip opening 104. As a membrane, part 105 is sensitive to external pressure changes arriving from z-direction through opening 104, bending the membrane to deform it inwardly and outwardly of opening 104.

As FIG. 1 shows, a cover 140 is attached to the surface 110a of the carrier and portions of inset 120. Cover 140 may be made of metal such aluminum, or it may be plastic such as a molded part. Cover 140 is shaped like a can to encapsulate chip 101 and electrical connections 130, and has a vent 141, which extends through the height of cover 140. Vent 141 is aligned with the second perforation 122 of inset 120. This alignment allows a continuous spatial connection of vent 141 through channel 117 to the movable part 105 at the end of chip opening 104.

Figure 2A:
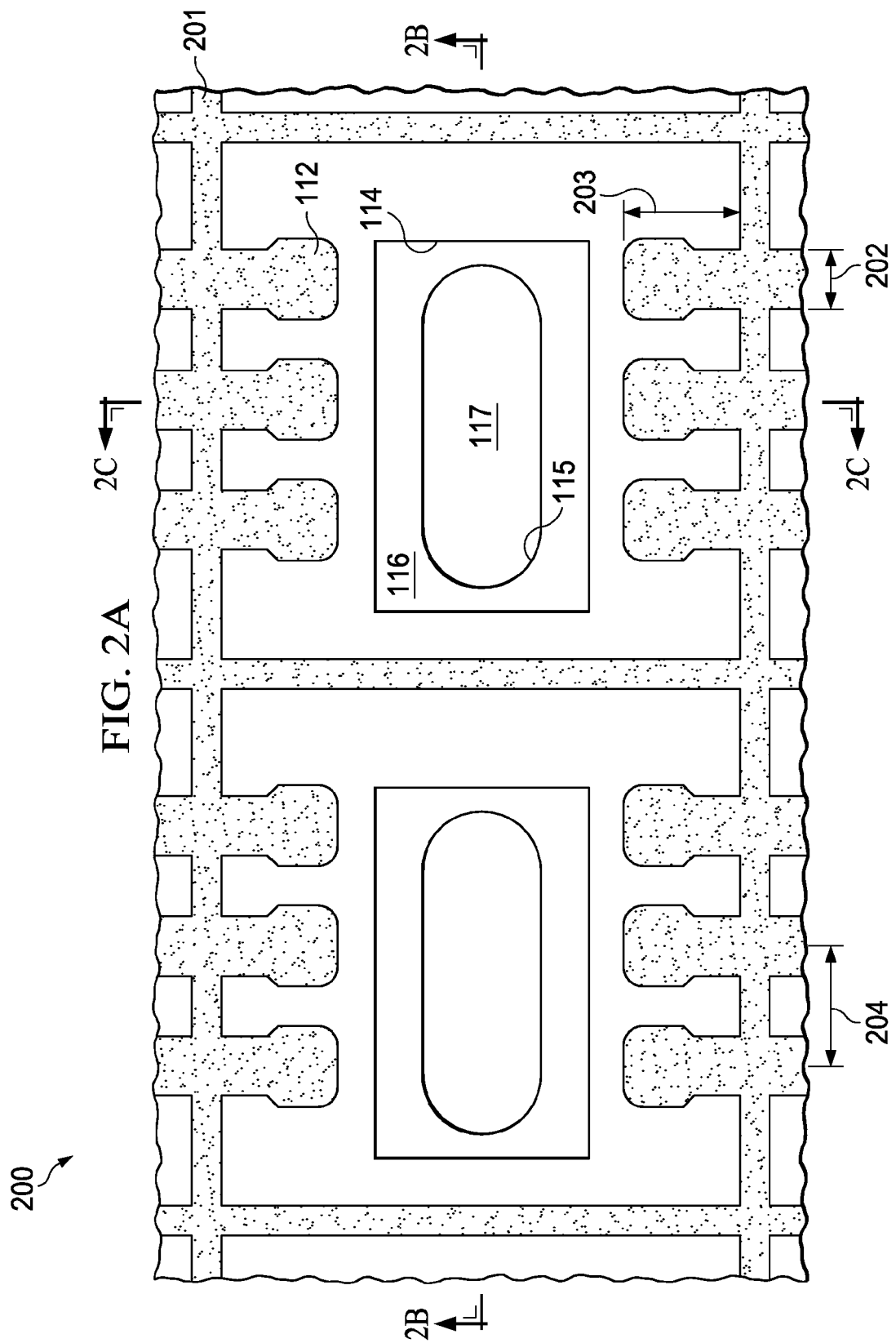
FIG. 2A is a top view of a portion of an example pre-molded leadframe strip used for fabricating a plurality of MEMS according to the invention.

FIGS. 2A, 2B, and 2C illustrate an example of a portion of a carrier generally designated 200, including a leadframe strip embedded in pre-molded compound, used for fabricating the MEMS device illustrated in FIG. 1. FIG. 2A shows a top view of a portion of the example original metallic leadframe strip surrounded by molding compound. The example leadframe resembles the leadframes used in conventional semiconductor technology for QFN- (Quad Flat No-Lead) and SON-type (Small Outline No-Lead) devices.

The metal in the portion of the leadframe strip in FIG. 2A is shaded. For many MEMS device embodiments, the leadframe strip is made from a sheet metal of copper or a copper alloy In other MEMS devices, the leadframe strip may be made of a leadframe strip of aluminum or an aluminum alloy. For facilitating wire attachment in the bonding step, one leadframe surface may have plated spots of thin layers of silver or gold For facilitating solder attachment in the assembly step, the opposite leadframe surface (not shown in FIG. 2A) may have a plated layer of tin, or plated thin layers of nickel and of a noble metal such as palladium or gold. The leads have a height (see FIG. 2C) which reflects the thickness of the metal sheet.

In the example of FIG. 2A, leadframe portion includes two square-shaped units of a side length of approximately 2 mm, outlined and connected by rails, or tie bars, 201. Attached to the rails, each unit includes a plurality of leads 112 In the example of FIG. 2A, there are six leads grouped in two sets of three leads positioned symmetrically on opposite rails. The units, however, do not include the conventional pad for attaching the semiconductor chip, which, in typical leadframes, is located remotely from the rails (or periphery). Instead, the central portion of the units remains open space. In the example, leads 112 have a width 202 of about 0.25 mm at the attachment to the rails, a length 203 of about 0.5 mm, and a pitch 204 center-to-center of about 0.5 mm.

The top view of the carrier 200 in FIG. 2A displays the area of the step 116, which separates the first tier and the second tier of the recess in the molded portion of carrier 200. FIG. 2A indicates the edge line of first tier 114 and the edge line of the second tier 115. The bottom area of the second tier forms the channel 117 of the finished device.

The cross section of the carrier 110 in FIG. 2B illustrates the height 111a of the plastic portion 111 of the carrier and the outline of the two-tier recess in the plastic portion. Since the leadframe may be embedded in the encapsulation compound by a molding process, height 111a of the plastic carrier portion is the same as the leadframe height (see also FIG. 2C). The depth 216 of the recess, extending from the surface 110a of the carrier to the bottom of channel 117 formed by the second tier, is smaller than the height 111a. The first portion of depth 216 is the first tier 114 and the second portion is the second tier 115. The embodiment of FIG. 2B shows the tiers to contribute equal amounts to the total depth 216 In other embodiments, they contribute unequal amounts. The recess volume created by the first tier will be filled by inset 120 (see FIGS. 3B and 3C). Since first tier 114 has a larger width than the second tier 115 (about 15% in the embodiment of FIG. 2B), the step 116 is formed between them. Step 116 provides the support for inset 120 as displayed in FIG. 1.

In the leadframe used for the embodiment in FIG. 2B, the tie bars 201 are shown to have a smaller height than the height 111a of the carrier, which, as stated, is equal to the thickness of the original leadframe. This feature facilitates the operation of trimming the leadframe strip and singulating the discrete units from the strip after completing the assembly and packaging processes. The feature is created by half-etching the metal of the leadframe strip along the tie bars.

The cross section of the carrier 110 in FIG. 2C illustrates the height 112a of the metallic lead portions 112 of the carrier together with the height 111a of the plastic portion 111. As stated above, height 112a is the same as height 111a. In other embodiments with different assembly needs for the semiconductor chip, the heights may be different. The recess displayed in the cross section of FIG. 2C features a wider area for step 116 than the recess displayed in the cross section of FIG. 2B, indicating a non-uniform width of step 116. In other embodiments, the width of step 116 may be uniform. In addition, the cross section of FIG. 2C displays shorter geometries of the first and second tiers and the channel 117 compared to the geometries of the tiers and the channel displayed in the cross section of FIG. 2B, indicating the elongated shape of the recess, the tiers, and the channel.

Figure 3B:
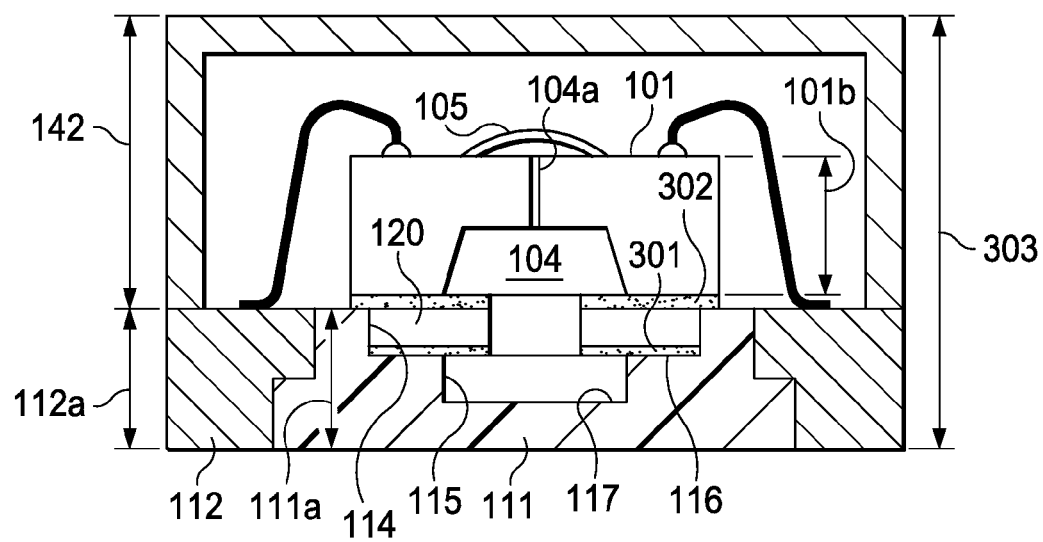
FIG. 3B is a cross section view taken along line 3B-3B of the singulated MEMS device of FIG. 2A, displaying a cross section of the inset resting on the molded ledge.
Figure 3C:
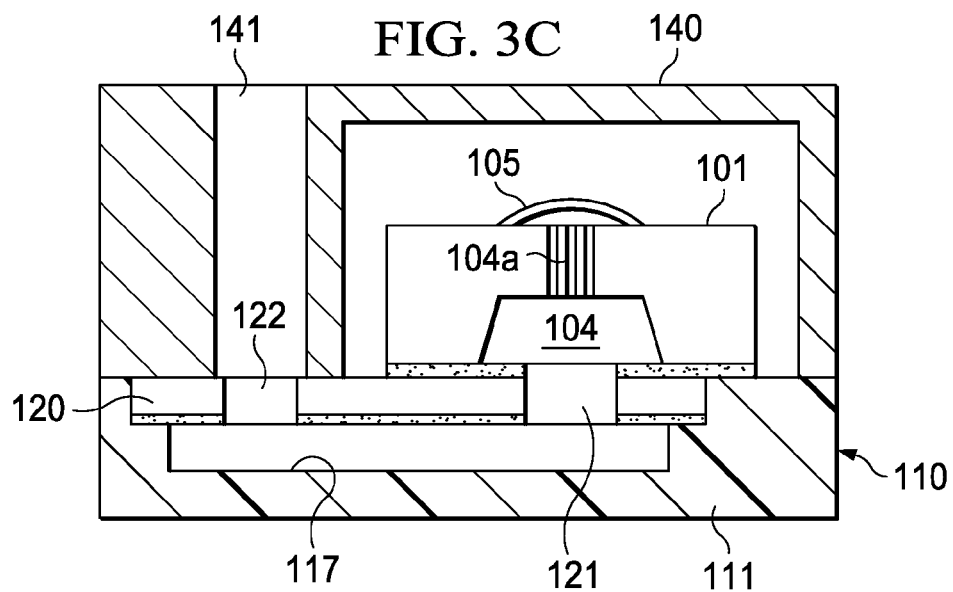
FIG. 3C is a cross section view taken along line 3C-3C of the singulated MEMS device of FIG. 3A, displaying another cross section of the inset resting on the molded ledge.

FIGS. 3A, 3B, and 3C illustrate top and cross-section views of the example embodiment shown in cutaway perspective view in FIG. 1. FIG. 3A is a top view of the embodiment generally designated 100 after singulating the leadframe strip into discrete units and attaching the cover for protecting the chip together with its membrane and bond wire connections. In the embodiment 100, the outline of cover 140 determines the outline of the completed MEMS device, and is about 2 by 2 mm. Reaching the top surface of the cover is vent 141, which has in this example MEMS device a circular outline. In other embodiments, the vent may have different outlines.

Indicated by dashed lines in the FIG. 3A top view are the semiconductor chip 101, which, in this exemplary MEMS, is shaped as a square with about 1 mm sides; the foil 105 capping the opening through the chip; the inset 120, which fills the first tier of the recess and has the first perforation 121 and the second perforation 122 on opposite ends; the second tier 115 of the recess, which provides the channel 117 between the first perforation and foil, and the second perforation and vent; and the leads 112 embedded in the carrier compound.

The FIG. 3B cross section view illustrates the common height 112a of the metallic leads 112 of the carrier and the height 111a of the plastic portion 111 of the carrier. The common height is a consequence of the pre-molding process of the leadframe to embed the leads and create a carrier. The recess displayed in the cross section of FIG. 3B features the formation of the air channel 117 from the second tier recess 115, after the inset 120 has been attached to step 116 of the pre-molded carrier by using, for example, a B-stage polymeric adhesive formulation designated 301. As mentioned above, the depth of the first tier in the example MEMS device is between about 0.12 and 0.13 mm, and the inset fills the first tier in height and area. Consequently, the thickness of inset 120, together with the thickness of the adhesive 301, is in the same range.

In FIG. 3B, the semiconductor chip 101 is attached partially onto inset 120 and partially onto plastic compound 111 by using, for instance, a B-stage polymeric adhesive formulation designated 302. The height 101b of chip 101 is between about 0.3 and 0.4 mm. Consequently, a height 142 of cover 140 between about 0.7 and 0.8 mm is sufficient to accommodate the arch heights of the wire ball bonds as well as the z-axis movements of foil 105. The total height 303 of the packaged MEMS falls thus into the range from approximately 1.0 to 1.3 mm. In FIG. 3B, the opening 104 of chip 101 is schematically shown to continue to foil 105 by one or more narrow portions 104a, such as through-silicon vias (TSVs); however, this feature is dependent on the function of the MEMS (pressure sensor, microphone, speaker, etc.). Consequently, in some devices, opening 104 may continue to foil 105 without constriction; in other devices, there may be a plurality of constrictions or TSVs.

The cutaway view of FIG. 1 displays the layout of the complete air channel in the example MEMS embodiment. The portion formed by polymeric compound 111 of carrier 110 includes channel 117. This channel connects the ambient inlet through the vent 141 of cover 140 with the movable part (foil, membrane) 105 at the end of opening 104 in chip 101. The air channel is facilitated by inset 120, which couples the channel 117 to chip opening 104 and foil 105 by the first perforation of the inset, and to the ambient and vent 141 by the second perforation 122 of the inset.

Another embodiment of the invention is a method for fabricating a MEMS device. In the first step of the process flow, a leadframe strip is provided, which has a plurality of units, wherein each unit has leads surrounding a central open space. As stated above, the units do not exhibit pads for attaching a chip. The units are held together by tie bars or rails. The rails and the leads are stamped or etched from a metal sheet with a height. For thinning, the rails are then half-etched to reduce the original metal thickness by about 50%. For many embodiments, the sheet material is copper. The copper surfaces may have treatments such as oxidation or roughening for enhancing adhesion to molding compounds. On one surface the leads may have spot-plated silver for facilitating wire bonding, and on the opposite surface the leads may have plated metal (such as nickel and palladium or gold) for facilitating solder attachment.

In the next process step, the open space of the units is filled with a polymeric compound, thereby embedding the leads and forming a plate-like carrier having the height of the leads, and a common surface with the leads. For many embodiments, a low-cost technique for filling the open spaces is the transfer molding technique: The strip is loaded in a steel mold with a cavity of the length of the strip and a height of the leadframe thickness. An epoxy-based encapsulation compound with a high percentage of inorganic fillers is pressed into the cavity to embed the leadframe strip. As a result, the strip is formed into a robust plate-like carrier, which resembles the carrier of many QFN and SON semiconductor devices.

Concurrently with the step of filling the open space in each unit, a two-tier recess is created in the central area of the space of each unit so that the recess extends from the surface of the carrier to a depth, which is smaller than the height of the carrier. In addition, the recess is formed so that a step projects from the first to the second tier around the recess periphery. The step marks the transition from the first to the second tier.

Insets are then provided as piece parts. An inset is attached to the step of each unit, preferably using a B-stage epoxy-based adhesive film. The inset is structured to exhibit the contour, area, and thickness of the first tier recess and is thus able to fill the first tier. The inset further has a first perforation at one end of the inset, and a second perforation at the opposite end of the inset. After the inset has been attached to the step, it acts as a lid to the second tier recess, confining the space of the second tier to act as an air channel. It is advantageous for many embodiments to have the inset made of low-cost polysilicon, since this choice renders the inset's CTE equal to the chip's CTE, reducing thermo-mechanical stress. Alternatively, the inset may be made of plastic or a metal such as copper.

In the next process step, integrated circuit chips are provided, wherein each chip has at least one opening extending through the chip thickness. At the circuit side of the chips, each opening is capped by a foil, which is thin enough to function as the movable part of the MEMS device. At the side of the chip opposite to the circuit, the opening is unobstructed. A chip is attached onto the inset of each unit so that the chip opening is aligned with the first perforation of the inset. The attachment process preferably uses a B-stage epoxy-based adhesive film. The terminals of each chip are then connected to the leads embedded in the carrier of each unit; the ball wire bonding technique offers a low-cost method.

Next, covers are provided, which may be shaped like a can to fit over the area of a unit and have a height sufficient to protect the chip and the wire bonds. The covers further have a vent through the height of the cover. A cover is attached to the surface of each carrier unit so that the vent is aligned with the second perforation of the inset and the cover encapsulates the chip of the unit.

Finally, the packaged units are singulated from the strip. The low-cost technique is a sawing step along the leadframe rails which cuts through the half-etched rails and the thinner molding compound. Alternatively, the package substrates may be singulated prior to the addition of the insert or prior to the addition of the chip, allowing the manufacture of the package substrates to be independent of the manufacture of the finished devices.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any material for the MEMS device package, including plastics and ceramics, and to any integrated, including silicon, silicon germanium, gallium arsenide, or any other semiconductor or compound material used in manufacturing.

As another example, the use of a pre-molded leadframe with inset as a carrier with an air channel for the package of a MEMS device can be applied to piezoresistive pressure sensors, where the conversion of pressure to an electronically detectable signal relies on the elastic deformation of a membrane, or generally of a structure, that is exposed to the pressure.

As another example, the use of a pre-molded leadframe with inset as a carrier with an air channel for the package of a MEMS device can be applied to resonant pressure sensors, where the resonance frequency depends on the mechanical stress in the vibrating microstructure.

As another example, the recess may be formed having a single tier covered by the inset. For example, the inset could be fit inside the single tier and be spaced apart from the bottom of the tier to form an air channel. The spacing may be controlled by standoffs inserted in the recess, molded into the recess, or formed as part of the inset. In a similar manner, the inset may be positioned on the upper surface of the package substrate and optionally include one or more structured formed in the inset extending into the recess to ensure alignment of the inset.

In yet another example, the second perforation may be embodied by a gap between an edge of the inset and an edge of the recess. The second perforation is not required to be enclosed by the package cover, although covering the second perforation limits access to the second perforation and the air channel by particulates. The use of a cover also allows both the length and shape of the passage from the second perforation to the environment to be tuned for particular applications.

It is therefore intended that the appended claims encompass any such modifications or embodiments.

We claim:

1. A microelectromechanical system (MEMS) device, comprising:
   a carrier having an upper surface and a peripheral edge, the carrier having a stepped recess formed centrally in the upper surface away from the peripheral edge;
   a plurality of metal leads embedded along the peripheral edge of the carrier;
   an inset attached at a step within the recess, the inset having first and second openings in communication with each other through a channel in the recess;
   an integrated circuit chip attached to the inset, the chip having an opening extending through the chip in communication with the recess through the first opening of the inset;
   a movable part extending over the chip opening; and
   a cover attached to the carrier, the cover enclosing the chip and having a vent in communication with the recess through the second opening of the inset.

2. The MEMS device of claim 1, wherein the stepped recess is configured with a first tier extending from the carrier surface to the step at a first depth and with a second tier extending from the step at the first depth to a second depth, a sum of the first and second depths being less than a thickness height of the carrier.

3. The MEMS device of claim 2, wherein the inset is dimensioned to fill the first tier and cover the second tier of the recess.

4. The MEMS device of claim 3, wherein the channel is defined below the first tier by at least a portion of the covered second tier.

5. The MEMS device of claim 4, wherein the first and second depths are equal.

6. The MEMS device of claim 4, wherein the movable part is a membrane stretching across and capping the chip opening.

7. The MEMS device of claim 6, wherein the membrane is a flexible metal foil configured to deform inwardly and outwardly in response to external pressure changes communicated from the vent to the chip opening through the channel by the first and second inset openings.

8. The MEMS device of claim 7, wherein the inset has an upper surface at a same level as the upper surface of the carrier, and the cover is attached to the upper surface of the carrier and the upper surface of the inset.

9. The MEMS device of claim 8, wherein the metal leads comprise metal leads having a thickness coequal with the thickness height of the carrier.

10. The MEMS device of claim 9, wherein the vent comprises an opening in the cover aligned with the second opening of the inset.

11. The MEMS device of claim 1, wherein the movable part is a membrane stretching across and capping the chip opening.

12. The MEMS device of claim 11, wherein the membrane is a flexible metal foil configured to deform inwardly and outwardly in response to external pressure changes communicated from the vent to the chip opening through the channel by the first and second inset openings.

13. The MEMS device of claim 1, wherein the inset has an upper surface at a same level as the upper surface of the carrier, and the cover is attached to the upper surface of the carrier and the upper surface of the inset.

14. The MEMS device of claim 1, wherein the metal leads comprise metal leads having a thickness coequal with a thickness of the carrier.

15. The MEMS device of claim 1, wherein the vent comprises an opening in the cover aligned with the second opening of the inset.

* * * * *